United States Patent [19]

Yu et al.

[11] 3,836,872

[45] Sept. 17, 1974

[54] AVALANCHE DIODE OSCILLATOR

[75] Inventors: Se Puan Yu; Wirojana Tantraporn, both of Schenectady, N.Y.

[73] Assignee: General Electric Company, Schenectady, N.Y.

[22] Filed: Sept. 21, 1973

[21] Appl. No.: 399,314

[52] U.S. Cl. .............................. 331/107 R, 331/96

[51] Int. Cl. .............................................. H03b 5/12

[58] Field of Search .......................... 331/107 R, 96

[56] References Cited

UNITED STATES PATENTS

| | | | |
|---|---|---|---|
| 3,624,557 | 11/1971 | De Loach, Jr. | 331/107 R |
| 3,721,919 | 3/1972 | Grace | 331/107 R |
| 3,743,966 | 2/1972 | Grace | 331/107 R |

*Primary Examiner*—John Kominski

*Attorney, Agent, or Firm*—Julius J. Zaskalicky; Joseph T. Cohen; Jerome C. Squillaro

[57] ABSTRACT

A circuit for the operation of an avalanche diode in the TRAPATT mode includes a capacitor connected in shunt with the diode and charged from a high impedance current source to a voltage which produces oscillations across the capacitor. Means are provided for varying the charging rate of the capacitor to vary inversely the frequency of the TRAPATT oscillations.

7 Claims, 4 Drawing Figures

AVALANCHE DIODE OSCILLATOR

The present invention relates in general to high frequency oscillators utilizing avalanche diodes and in particular to circuits the operating parameters of which are set with respect to the dynamic characteristics of the avalanche diode to provide high frequency oscillations.

Avalanche diodes in a variety of forms are utilized in circuits to provide high frequency oscillations. In one form the avalanche diode comprises a body of semiconductor material including an end region of one conductivity type and relatively high conductivity, an intermediate region of opposite conductivity type and of relatively moderate conductivity, and another end region of opposite conductivity type and relatively high conductivity. Conveniently, such diodes are designated in the art as P+NN+ or N+PP+ diodes. In one mode of operation of such diodes as oscillators, referred to as the IMPATT (Impact Avalanche Transit Time) mode, a resonant circuit is connected across the ends of the diode and the diode is reversely biased from a d-c source at a point on the static current versus voltage characteristic where substantial avalanche multiplication of conduction carriers occurs (i.e., avalanche multiplication of the order of 1,000,000 in the intermediate region adjacent the PN junction. In steady state operation the conduction carriers of appropriate sign produced by the avalanche process move under the influence of the electric field in the intermediate region at close to saturation drift velocity and are collected at the end region remote from the PN junction. The frequency of the resonant circuit and the distance traversed by the conduction carriers in the intermediate region are correlated so that the time of transit of the avalanche carriers under the influence of electric field at saturation drift velocity substantially equals one-half the period of the high frequency wave. The current flow in the external resonant circuit due to the motion of conduction carriers in the intermediate region is substantially 180° out of phase with the high frequency voltage across the resonant circuit. Accordingly, energy from the power supply is converted into high frequency energy in the resonant circuit. In this mode of operation frequencies of tens of gigaHertz may be obtained with suitably constituted and proportioned avalanche diodes, and suitably tuned circuits.

In another conventional mode of operation of the avalanche diode, referred to as the TRAPATT (Trapped Plasma Avalanche Transit Time) mode, voltage in excess of the voltage required to produce IMPATT mode of operation is provided across the diode by the dc bias voltage source and an auxiliary high frequency voltage source. Such a large voltage across the diode produces an electric field intensity profile in the intermediate region which is sufficient to create an avalanche of electron-hole plasma in the highest field portion of the diode and causes collapse of the field in that portion. If the displacement current density so produced in the diode is greater than the background or fixed charge density times the saturation velocity of majority carriers, an avalanche shock front or traveling avalanche zone traverses the intermediate region from the end adjacent the PN junction to the other end thereof. The avalanche zone sweeps across the depleted intermediate region in a time equal to the background charge density times the width of the intermediate region divided by the displacement current density. This time is shorter than the time of transit of charge carriers moving at saturation drift velocity across the intermediate region. In the highly conducting state, the voltage across the diode will be small and the velocity of the carriers will be less than saturation drift velocity. During this period a large circuit dependent external current will result in the extraction of the plasma. At the end of the extraction period the diode field profile will again be close to breakdown condition ready for another cycle of operation triggered by the auxiliary circuit.

Thus, in the TRAPATT mode, the cycle of operation may be divided into three periods. An initial period during which the diode is depleted of conduction carriers occurs, a second period during which an electron-hole plasma is formed and a third period during which the electron hole plasma is extracted or removed from the intermediate region. Current through the diode is high when the voltage across the diode is low and conversely when the voltage across the diode is high the current through the diode is low. Accordingly, high efficiency oscillations may be produced when the avalanche diodes are operated in suitable circuits. The frequency of oscillation is substantially lower than the frequency of oscillation produceable in the IMPATT mode of operation of the diode as charge carriers in the form of plasma are removed at low fields. The auxiliary circuit utilized for providing the high values of avalanche multiplication prior to plasma formation may be a resonant circuit, the resonant frequency of which is harmonically related to the frequency of operation in the TRAPATT mode. A distinctive element of operation of the avalanche diode in the TRAPATT mode is the fact that an avalanche shock front is produced and it traverses the intermediate region of the diode in a time short compared to the time of transit of carriers at saturation drift velocity. The literature is replete with descriptions of avalanche diodes and their circuits for both IMPATT and TRAPATT modes of operation. A survey of such diodes and their circuits is contained in an article by Bernard C. Deloach, Jr. in IEEE Journal of Solid State Circuits, Vol. SC-4, No. 6, Dec. 1969, entitled "Modes of Avalanche Diodes and Their Associated Circuits."

Heretofore, complex and bulky circuit arrangements were necessary to provide the large driving voltage necessary to develop TRAPATT oscillations. In such circuits varying the frequency of suh oscillations were both difficult and limited in range.

The present invention is directed to providing simple and compact circuits for use with avalanche diodes for developing TRAPATT type oscillations and also to provide simple means for varying the frequency of such oscillations.

Another object of the present invention is to provide circuits for producing TRAPATT or anamalous mode oscillations in available diodes by circuits which are easy to operate.

Another object of the present invention is to provide circuits for operating avalanche diodes in the TRAPATT mode which are not only reliable in starting but are rapidly started to provide TRAPATT mode oscillations.

A further object of the present invention is to provide TRAPATT mode oscillations in conjunction with avalanche diodes operating at low average current densities.

In carrying out the invention in one illustrative embodiment thereof there is provided an avalanche diode comprising a body of semiconductor material including a pair of electrodes secured thereto and an intermediate region of length L and of relatively low conductivity. The doping or net activator concentration in the intermediate region is selected so that the integral of $n$ over the length L, referred to as the n L product or charge density integral, is less than 0.5 times $10^{12}$ $cm^{-2}$ for silicon. For an avalanche diode to operate effectively in the IMPATT mode the integral of n over the length L should be greater than 1.5 times $10^{12}$ $cm^{-2}$. Thus the diode is designed so that it cannot operate efficiently in the IMPATT mode even in a suitably designed circuit. A capacitor is provided between the electrodes of the diode. The circuit structure including the capacitor is preferably designed to avoid resonant modes therein, or if resonant modes occur, they are so heavily loaded that IMPATT oscillations cannot be maintained. A source of charging current is connected in circuit with the capacitor to charge the capacitor to a voltage at which the intermediate region is depleted of majority carriers and exceeds the voltage at which substantial avalanche multiplication of conduction carriers occurs in the intermediate region. The current source provides current flow to the capacitor which causes the voltage across the capacitor to continue to rise after initiation of substantial avalanche multiplication in the diode to a value at which an avalanche shock front occurs in and traverses the intermediate region to generate an electron-hole plasma therein. The capacitor has a capacitance in relation to the voltage at which substantial avalanche multiplication occurs in the diode to hold sufficient charge therein to supply the intermediate region with charge to fill the intermediate region. The current source, the capacitor and the diode are constituted so that charge flow into the diode during plasma generation substantially exceeds the charge flow into the capacitor from the source whereby the voltage on the capacitor is sharply reduced to a small absolute value in relation to the peak voltage at which substantial avalanche multiplication occurs and avalanching of carriers and plasma generation is extinguished in the intermediate region of the diode. The reduced voltage on the capacitor sweeps plasma charge from the intermediate region of the diode and allows the capacitor to be charged again to a value of voltage above the voltage at which substantial avalanche multiplication occurs to initiate another cycle of operation. A load is coupled to the capacitor for deriving an output. Means are provided for varying the level of charging current to the capacitor to vary the frequency of operation in inverse relationship to the level of charging current.

The features of the invention which are believed to be novel are set forth with particularity in the appended claims. The invention itself, however, both as to its organization and method of operation, together with further objects and advantages thereof may best be understood by reference to the following description taken in connection with the accompanying drawings in which FIG. 1 is a diagram partially in block form and partially in section of an avalanche diode in combination with circuit elements in accordance with one aspect of the present invention.

Figure 1:
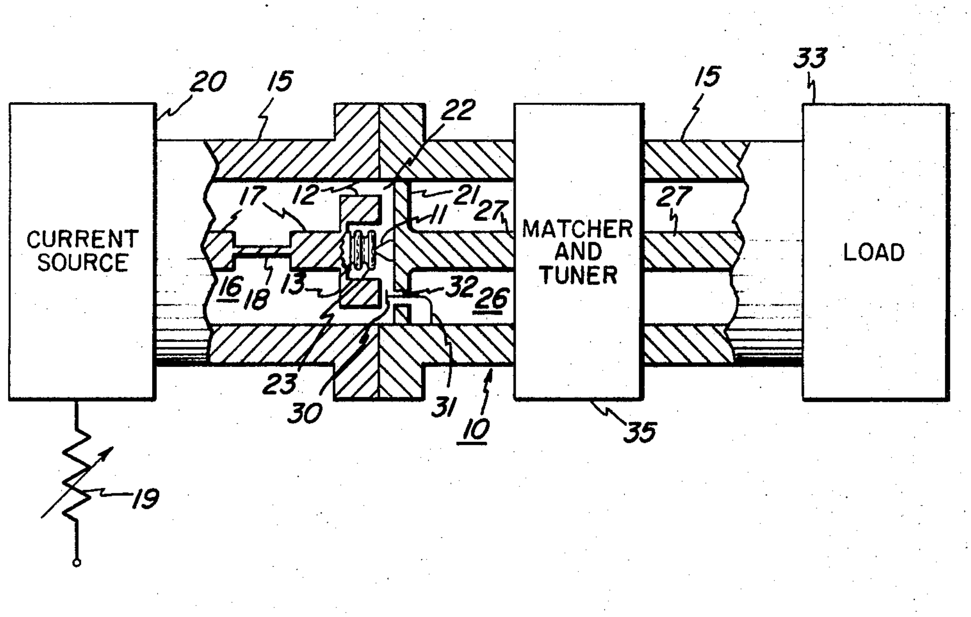

Reference is now made to FIG. 1 which shows apparatus 10 including an avalanche diode 11 and circuit elements in the form of sections of transmission line for generating high frequency oscillations. The apparatus includes a capacitor 12 in the form of a conductive disc 13 coaxially aligned and spaced with respect to a cylindrical outer conductor member 15. There is provided an input section of coaxial transmission line 16 including the outer conductor member 15 and the inner conductor 17 coaxially aligned with respect to the outer conductor. The inner conductor includes a portion 18 of reduced cross section. One end of inner conductor 17 is connected to a side wall of conductive disc 13. A source 20 of unidirectional current variable in level by control 19 is connected to the other end of the inner connector 17 and to the outer conductor 15 to provide charging current to the capacitor 12. A conductive wall member 21 is provided transverse to the axis of the cylindrical conductor member 15 to complete the bias circuit for the diode. A conductive bellows member 23 which is axially extendable is provided in a recessed portion of the disc 13 and makes conductive connection to one terminal of the diode 11, the other terminal of which is connected to the conductive wall member 21. The diode 11 is coaxially aligned with the inner conductor 17 of the transmission line. The capacitance provided between the disc 13 and the outer conductor 15 as well as to a certain extent with the conductive side wall 21 represents capacitance which is charged from the current source. The source 20 should be capable of providing current to charge capacitor 12 to voltages at which substantial avalanche multiplication of conduction carriers occurs in the diode as will be explained below.

An output section 26 of transmission line is also provided and includes the outer conductor member 15 and another inner conductor member 27 coaxially aligned therewith. One end of conductor member 27 is connected to the transverse conductive member 21. Oscillations developed across the capacitor 12 are coupled to the input portion of the output section 26 of transmission line by a probe which includes a capacitive plate 30 spaced from a sidewall of the disc 13 and a lead 31 extending through an opening 32 in the wall 21 to a point on the outer conductor member 15. The other end of the output section 26 transmission line is provided with a suitable energy utilization or load device indicated schematically by a block 33. Between the ends of the output section 26 of the transmission line is located a matching section 35 to provide impedance matching and output circuit tuning as desired. The matching section may include a plurality of capacitive probe elements conductively connected to the outer conductor 15 at appropriate points along the length thereof and adjustably spaced from the inner conductor 27 for matching the impedance of the load 33 to the impedance seen at the input end of the output section 26, that is, in effect matching the impedance of the source represented by the coupling probe to the impedance of the load to assure maximum power transfer. Also, the impedance matching section 35 may provide a desired degree of coupling between the load and the coupling probe to establish a desired loading in the apparatus. The impedance matching section 35 may be utilized to provide a broad band or low Q resonant output circuit as seen by the diode.

The diode device 11 may be any of a variety of avalanche diodes which are designed to operate in the TRAPATT mode. One form of commonly used device comprises a body of semiconductor material including an end region of one conductivity type and relatively high conductivity, an intermediate region of opposite conductivity type and of relatively moderate conductivity and another end region of the opposite conductivity type and of high conductivity. Such diodes are conveniently designated as P+NN+ and N+P P+ diodes. For an N+PP+ diode, the conductivity in the intermediate region may, for example, be of the order of $10^{15}$ net acceptor activator concentration and the net activator concentration in the end regions may be several orders of magnitude higher, for example $10^{18}$. The extent of the intermediate region between the end regions is such as to allow intermediate region to be depleted at reasonable reverse bias voltages and to establish electric fields adjacent the PN junction end of the region which will produce substantial avalanche multiplication of conduction carriers. As pointed out above, the integral of $n$, the net activator concentration in the intermediate region, over the length L of the intermediate region is preferably less thqn 0.5 times $10^{12}$ $cm^{-2}$. Other diodes such as Schottky diodes, i.e., a diode in which the rectifying junction is formed by a metal member in place of a semiconductor end region, properly proportioned and constituted would work equally as well in the apparatus of FIG. 1.

The variable source of current 20 may be any suitable high impedance source and in one form may include a source of unidirectional voltage and a large impedance connected in series therewith. Variation of the level of current flow could be accomplished by variation in the value of the impedance. The source voltage is selected so that it is well in excess of the voltage required to produce large values of avalanche multiplication in the diode suitable for supporting TRAPATT mode operation. By utilizing a small portion of the charging characteristic of the capacitor a substantially uniform rise in voltage across the capacitor may be obtained. Such a combination of voltage source and large impedance would be an essentially constant current source and would have sufficient capability to drive the voltage across the capacitor to values which produce substantial avalanche multiplication of charge carriers in the diode. The source of current could be periodically interrupted at a low frequency rate to provide pulse modulation of the output of the apparatus and also to avoid overheating the diode.

Figure 2:
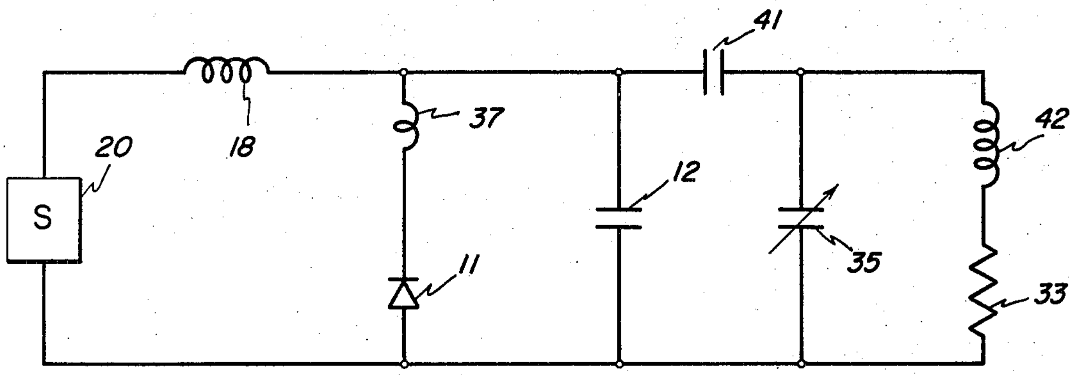
FIG. 2 is an equivalent circuit representation of the diode and circuit shown in FIG. 1.

Reference is now made to FIG. 2 which shows an equivalent circuit of the apparatus of FIG. 1 in which elements thereof corresponding to elements of FIG. 1 are identically designated. The inductive member 18 is a high impedance at the TRAPATT frequencies of operation of the apparatus and limits the flow of high frequency energy to the variable current source 20. The source 20 is connected so that the diode 11 is reversely biased. The inductive element 37 represents series lead inductance of the diode 11 and is preferably quite small. The capacitor 12 is the capacitance across which voltage builds up in response to current flow from the current source 20 to values which will produce the operation which will be explained in detail in connection with FIGS. 3 and 4. The capacitance 12 is the capacitance of the cylindrical portion of the disc 13 in respect to the outer conductor member 15 as well as the capacitance of the sidewall thereof with respect to the sidewall 21. As pointed out above, the diode is designed to have an $n$ L product which is not conducive to IMPATT mode oscillations. The biasing circuit structure, including the outer conductor 15, the inner conductor 17 and the side wall 21, for the capacitor 12 is designed to avoid the formation of resonant modes. In the circuit structure shown in FIG. 1, the capacitance of the side wall of disc 13 in relation to side wall member 21 is made relatively large to provide loading of the cavity 22 formed by the aforementioned elements. Accordingly, when the capacitance 12 is charged to a voltage sufficient to cause substantial avalanche multiplication in the diode, IMPATT oscillations are not developed. The capacitance 41 represents the capacitance of the plate 30 in respect to the sidewall of disc 13. The inductance 42 represents the inductance of the lead 31 as well as any inductance seen by the output transmission line section 26. The resistive load 33 is the resistance of the utilization source as seen through the matching section 35 at the coupling probe. The matching section 35 is represented by the variable capacitor connected essentially in shunt with inductance 42 and resistive load 33. The resonant circuit generally represented by elements 42, 35 and 33 is tuned to provide essentially resistive loading across the capacitor. Preferably the resonant circuit is tuned to provide a broad band or a low Q resonant circuit coupled to the capacitor 12 to facilitate operation and tuneability of the TRAPATT mode oscillations.

The operation on the system of FIGS. 1 and 2 will now be explained in connection with FIGS. 3 and 4 which show graphs of voltage across and total current through the diode as a function of time for two different rates or levels of current flow into the capacitor 12 to provide TRAPATT oscillations of different frequencies. First, reference is made to FIG. 3 in which the graph 55 represents voltage across the charging capacitance and graph 56 represents current flow through the diode 11. The point 57 is the value or level of voltage at which substantial avalanche multiplication (for example, 1,000,000 of conduction carriers occurs in the diode. The slope of graph 55 represents a particular level of the current flow into the capacitor 12. Voltage across the capacitor rises to a voltage corresponding to the point 57 at which substantial avalanching of charge occurs in the intermediate region of the diode. The voltage continues to rise until an electron-hole plasma is produced in the diode which causes the voltage across the diode to drop to a low value as indicated at 58. During the period of avalanche formation the current 56 rises to a peak 59 and then decays to a low value 61. The small electric field existing across the diode 11 removes the plasma from the diode. The plasma extraction condition is indicated by the portion of the current graph 56. After the plasma has been substantially removed from the diode, the diode reverts to its depletion or high impedance condition thereby allowing the current source 20 to again charge the capacitor 12 to the voltage level 57 and beyond to the peak 62 at which time the cycle of operation is repeated. The period of the voltage wave developed is indicated as the time between the points 62 of successive sawtooth voltage waves.

Figure 3:
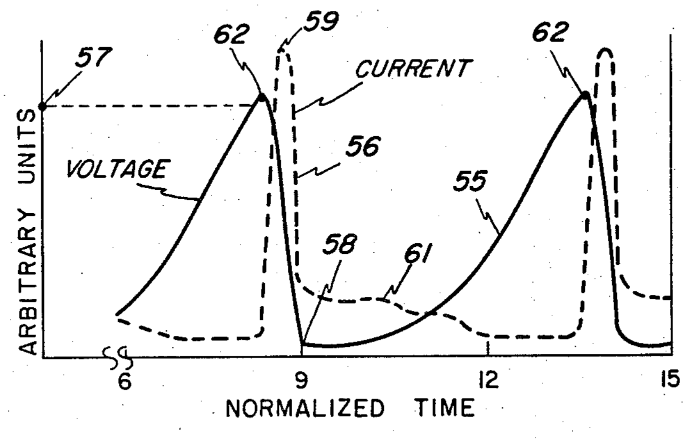
FIG. 3 shows a graph of voltage across the diode and current therethrough as a function of time for two periods of steady state oscillation of the circuit of FIG. 1 for one level of charging current flow to the charge storage capacitor.
Figure 4:
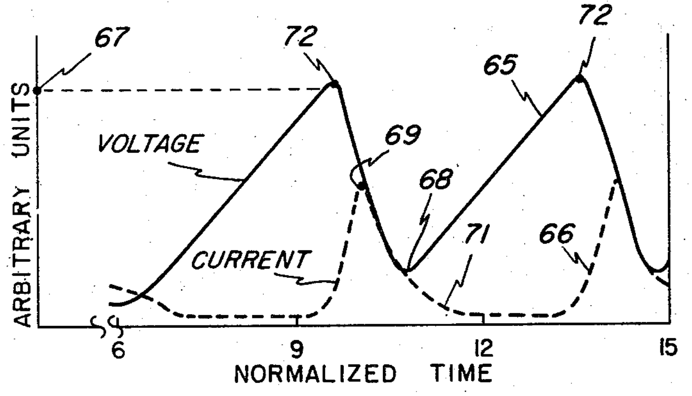
FIG. 4 shows a graph of voltage as a function of time across the diode and current flow therethrough for two periods of steady state oscillation of the circuit FIG. 1 for another level of charging current flow into the charge storage capacitor less than the current level of FIG. 3.

Reference is now made to FIG. 4 which shows the operation of the circuit of FIG. 1 under a condition in which the level of charging current is lower than the level charging current in the operation depicted in FIG. 3. The variable current source 20 is readily adjusted to provide a smaller rate of rise in voltage across the capacitor 12. In this figure the graph 65 represents voltage across the capacitor 12 and the graph 66 represents current flow through the diode 11. Along the ordinate level or point 67 represents the voltage at which substantial avalanche multiplication of charge carriers occurs in the diode. Voltage across the capacitor rises to value 72, slightly less than the voltage 62 in the higher level current flow case of FIG. 3, shortly after which voltage across the diode is reduced to a low value 68 by plasma formation in the diode. Current flow into the diode rises to a peak 69 lower than peak 59 of FIG. 3. In this case as the rate of rise of voltage is slower than in the case of FIG. 3 less electron-hole plasma is formed by the avalanche multiplication process and the drop in voltage across the diode is less than in the case of FIG. 3. Also, the plasma is more rapidly removed by the residual field which is also higher than in the case of FIG. 3. Accordingly, as the residual field is greater and the plasma formation is less, the diode reverts more rapidly to its high impedance state and the voltage across the capacitor is again charged along the rising portion of the voltage curve. As the voltage across the capacitor did not drop nearly as much as it did in the case of FIG. 3, and as it started to rise sooner, the peak value 72 of voltage at which avalanche action and plasma formation is initiated is reached sooner than in the corresponding case of FIG. 3. The time period between voltage peaks 72 is less, and consequently the frequency of operation, is greater. Thus, by varying the rate of current flow into the capacitor the frequency of the TRAPATT mode oscillations produced in the circuit may be varied. Decreasing the level of charging current causes an increase in the frequency of oscillation.

While the invention has been described in a specific embodiment, it will be appreciated that modifications may be made by those skilled in the art, and we intend by the appended claims to cover all such modifications and changes as fall within the true spirit and scope of the invention.

What we claim as new and desire to secure by letters Patent of the United States is:

1. In combination, an avalanche diode comprising a body of semiconductor material including a pair of electrodes secured thereto and an intermediate region of relatively moderate conductivity included therein, a capacitor connected between said electrodes of said diode, a source of charging current connected in circuit with said capacitor to charge said capacitor to a voltage at which said intermediate region is depleted of majority carriers and exceeds the voltage at which substantial avalanche multiplication of conduction carriers occurs in said intermediate region, said current source being constituted to provide current flow to said capacitor which causes the voltage across said capacitor to continue to rise after initiation of substantial avalanche multiplication in said diode to a value at which an avalanche shock front occurs in and traverses said intermediate region to generate an electron-hole plasma therein, said capacitor having a capacitance in relation to the voltage at which substantial avalanche multiplication occurs in said diode to hold sufficient charge therein to supply said intermediate region with charge to fill said intermediate region with plasma charge, said current source, said capacitor and said diode being constituted so that charge flow into said diode during plasma generation substantially exceeds the charge flow into said capacitor from said source whereby the voltage on said capacitor is substantially reduced and avalanching of carriers and plasma generation is extinguished in said intermediate region of said diode, said reduced voltage on said capacitor sweeping plasma charge from the intermediate region of said diode and allowing said capacitor to be charged again to a value of voltage above the avalanching voltage to initiate another cycle of oscillation.

2. The combination of claim 1 including means for varying the current from said source to vary the maximum voltage to which said capacitor is charged and to vary the resultant plasma formed in said intermediate region thereby varying the period of said cycle of operation in direct relationship with the magnitude of said current.

3. The combination of claim 1 in which a low Q resonant circuit is provided connected effectively in parallel with said diode.

4. The combination of claim 1 in which said diode comprises a body of semiconductor material including an end region of one conductivity type and relatively high conductivity, an intermediate region of opposite conductivity and of relatively moderate conductivity, and another end region of said opposite conductivity type and relatively high conductivity, one of said electrodes connected to one of said end regions and the other of said electrodes connected to the other of said end regions.

5. The combination of claim 1 in which said capacitor includes first and second conductive members, said first conductive member conductively connected to one of said second conductive members conductively connected to the other of said conductive electrodes.

6. The combination of claim 5 in which said first and second conductive members are closely spaced adjacent to the points of connection thereof to said electrodes to provide capacitive loading of said diode.

7. The combination of claim 1 in which the intermediate region of said diode is constituted of silicon and has a net activator concentration profile along the path between the electrodes of said diode such that the integral of the net activator concentration over the length of said path is less than $0.5 \times 10^{12}\text{cm}^{-2}$.

* * * * *